United States Patent [19]

Zell et al.

[11] Patent Number: 5,160,272
[45] Date of Patent: Nov. 3, 1992

[54] BACKPLANE WIRING

[75] Inventors: Karl Zell, Niederpoecking; Guenter Thom, Gauting, both of Fed. Rep. of Germany

[73] Assignee: Siemens Aktiengesellschaft, Munich, Fed. Rep. of Germany

[21] Appl. No.: 757,293

[22] Filed: Sep. 10, 1991

[30] Foreign Application Priority Data

Sep. 11, 1990 [DE] Fed. Rep. of Germany ... 9012949[U]

[51] Int. Cl.⁵ ........................................... H01R 13/648
[52] U.S. Cl. .................................... 439/101; 439/607
[58] Field of Search .................. 439/101, 108, 608, 92, 439/607, 181, 186

[56] References Cited

U.S. PATENT DOCUMENTS

| 3,237,146 | 2/1966 | Barker | 439/101 |
| 4,568,133 | 2/1986 | Amano et al. | 439/181 |
| 4,624,515 | 11/1986 | Brush, Jr. et al. | 439/608 |
| 4,737,116 | 4/1988 | Slye et al. | 439/92 |
| 4,806,109 | 2/1989 | Manabe et al. | 439/108 |

FOREIGN PATENT DOCUMENTS

3511344A1 10/1986 Fed. Rep. of Germany .

*Primary Examiner*—Gary F. Paumen
*Attorney, Agent, or Firm*—Hill, Van Santen, Steadman & Simpson

[57] ABSTRACT

In a backplane wiring system, individual plug devices are firmly connected to assembly PC boards, and are both capacitatively as well as inductively decoupled from one another by rectangular, metallic shielding housings open at one side which are slipped onto contact blades of the wiring backplane.

5 Claims, 1 Drawing Sheet

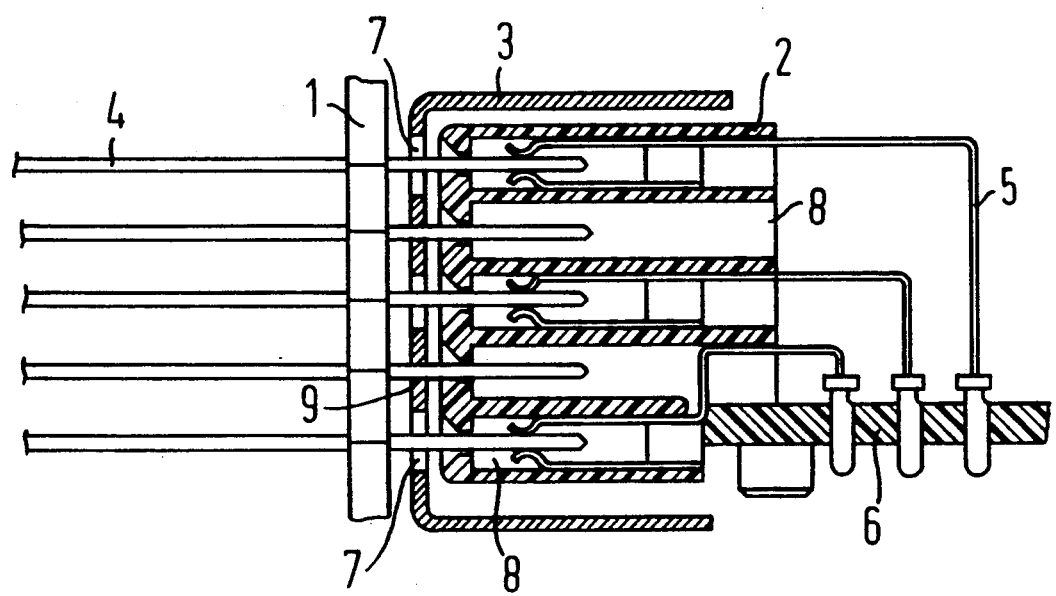

BACKPLANE WIRING

BACKGROUND OF THE INVENTION

The invention is directed to a backplane wiring for plug devices having receptacle chambers for contact springs for plugging onto the contact blades of a wiring backplane, whereby each of the plug devices is rigidly connected to an assembly piece PC board.

In assembly cabinets, such backplane wirings serve the purpose of connecting the individual assemblies to one another. Known backplane wirings have a basic grid of 2.5 mm in which the contact blades are arranged on the board. The individual contact blades are connected to one another with a multilayer arrangement. In many instances, a plugging of assemblies is also possible on both sides of the wiring backplane. In order to guarantee a full use of the wiring backplane, the individual plug devices are in very tight proximity to one another due to the high plug-in point density of the contact blades. Both capacitative as well as inductive couplings between the individual plug devices can thus arise, the transmission quality of the electrical signals to be transmitted being thereby deteriorated and misconnections on the individual assemblies potentially arising.

SUMMARY OF THE INVENTION

It is an object of the present invention to specify a backplane wiring of the type initially cited wherein the individual plug devices are both capacitatively as well as inductively decoupled.

In a backplane wiring of the type initially cited, this object is achieved in that rectangular, metallic shielding housings which are provided for the acceptance of the plug devices and are open at one side, can be slipped onto the contact blades such that some of the contact blades are rigidly connected to a shielding housing via tight-fitting apertures forming press fits, whereas the remaining contact blades project through apertures having clearances into the shielding housing. Thus, the receptacle chambers of the plug devices into which project the contact blades which are rigidly connected to the shielding housing, are not occupied with contact springs.

What is achieved is that individual plug devices are provided which are surrounded by rectangular, metallic shielding housings open at one side, and which are connected to ground potential. The plug devices are thus in close proximity and are still effectively decoupled from one another both capacitatively as well as inductively. The assemblies are thus prevented from mutually influencing one another.

An expedient development of the backplane wiring of the invention is that the inside dimensions of the shielding housing correspond to the outside dimensions of the plug device. An unnecessary occupation of space on the wiring backplane is avoided in this way.

BRIEF DESCRIPTION OF THE DRAWING

The drawing figure shows a backplane wiring system of the present invention in partial cross section.

DESCRIPTION OF THE PREFERRED EMBODIMENTS

In the illustrated backplane wiring, the wiring backplane 1 has a majority part thereof occupied with contact blades 4 in a basic grid of 2.5 mm. Plug devices 2 (one of which is shown in the drawing FIGURE are firmly connected to assembly PC boards 6, and can be plugged onto the contact blades. The spring clip plug device 2 has receptacle chambers 8 for the acceptance of contact springs 5 which form the actual contact with the contact blades 4. The individual contact springs 5 are connected to interconnects (not shown) of the assembly PC board 6.

For capacitive and inductive decoupling of neighboring plug devices 2, a rectangular, metal shielding housing 3 open at one side is provided according to the invention. Both apertures 7 with clearances as well as apertures 9 which provide press fits are provided in the floor of the shielding housing 3. The press fitting apertures 9 are provided everywhere that a contact of the shielding housing 3 to a contact blade 4 carrying ground potential should occur. In a backplane wiring of the invention, the receptacle chambers 8 of the plug devices 2, into which the contact blades 4 which carry ground potential project, are usually not occupied.

In order to keep the space requirement on the wiring backplane 1 as small as possible, it is necessary to match the inside dimensions of the shielding housing 3 to the outside dimensions of the plug device 2.

It is also conceivable in the illustrated backplane wiring that the contact blades 4 which carry ground potential are arranged such that specific contact blades or contact springs are both inductively as well as capacitatively decoupled from one another individually or in groups.

Although various minor changes and modifications might be proposed by those skilled in the art, it will be understood that we wish to include within the claims of the patent warranted hereon all such changes and modifications as reasonably come within our contribution to the art.

We claim as our invention:

1. A backplane wiring system, comprising:
   at least one plug device having receptacle chamber means with contact springs for plugging onto contact blades of a wiring backplane, the plug device being rigidly connected to a respective PC board;
   a metallic shielding housing means which accepts the plug device and which is open at one side and which can be slipped onto the contact blades such that at least one of the contact blades is rigidly connected to the shielding housing means via an aperture which press fits against the contact blade whereas remaining contact blades project through apertures into the shielding housing means and are not electrically connected thereto; and
   the receptacle chamber means of the plug device into which projects the contact blade which is rigidly connected to the sheilding housing means is not occupied with one of the contact spring.

2. A backplane wiring system according to claim 1, wherein inside dimensions of the shielding housing means correspond to outside dimensions of the plug device, with one shielding housing means being allocated to each plug device.

3. A system according to claim 1 wherein a plurality of plug devices are provided connected to respective assembly PC boards, and wherein each plug device has associated with it a separate one of the metallic shielding housing means.

4. A backplane wiring system, comprising:

a wiring backplane having a plurality of contact blades proceeding therethrough and being mounted thereto at substantially right angles to the wiring backplane;

a plurality of plug devices which are rigidly mounted on respective PC boards, each plug device having a plurality of receptacle chambers, some of which have contact spring means therein for electrically mating with a respective one of the contact respective blades entering the respective receptacle chambers through an aperture in a floor thereof, the contact spring means being electrically connected to respective interconnects on the respective PC board; and a metal shielding housing allocated to each respective plug device and receiving the plug device therein, the housing having a floor portion with clearance aperture means for permitting a respective contact blade to pass into a respective receptacle chamber without contacting the metal sheilding housing, and having press fit aperture means for press fit electrical contact with a respective contact blade passing therethrough into a respective receptacle chamber which does not have any contact spring means therein.

5. A backplane wiring system, comprising:

a wiring backplane having a plurality of contact blades projecting therefrom;

a plurality of plug devices which are connected to respective PC boards, each plug device having a plurality of receptacle chambers, some of which have contact spring means received therein for electrically mating with a respective one of the contact blades entering the respective receptacle chambers through an aperture in a floor of the plug device; and a metal shielding housing allocated to each respective plug device and receiving and closely surrounding except at a front thereof the plug device, the housing having a floor portion with clearance aperture means for permitting a respective contact blade to pass into a respective receptacle chamber without contacting the metal sheielding housing, and the housing having press fit aperture means for press fit electrical contact with a respective contact blade passing therethrough into a respective receptacle chamber which does not have any contact spring means therein.

* * * * *